(12) United States Patent
Jordan et al.

(10) Patent No.: US 6,417,109 B1
(45) Date of Patent: Jul. 9, 2002

(54) CHEMICAL-MECHANICAL ETCH (CME) METHOD FOR PATTERNED ETCHING OF A SUBSTRATE SURFACE

(75) Inventors: Stephen G. Jordan; G. Robert Gray, both of Fremont; Arun Malhotra, San Jose, all of CA (US)

(73) Assignee: Aiwa Co., Ltd., Tokyo (JP)

( * ) Notice: Subject to any disclaimer, the term of this patent is extended or adjusted under 35 U.S.C. 154(b) by 36 days.

(21) Appl. No.: 09/625,932

(22) Filed: Jul. 26, 2000

(51) Int. Cl.$^7$ .................. H10L 21/302; H10L 21/3065

(52) U.S. Cl. .................. 438/692; 438/700; 438/706; 438/712; 438/723; 438/724

(58) Field of Search .................. 438/692, 700, 438/706, 712, 723, 724

(56) References Cited

U.S. PATENT DOCUMENTS

| | | | |
|---|---|---|---|
| 5,665,201 A | * | 9/1997 | Sahota .................. 438/693 |
| 5,786,262 A | * | 7/1998 | Jang et al. .................. 438/424 |
| 5,926,722 A | * | 7/1999 | Jang et al. .................. 438/424 |
| 6,316,329 B1 | * | 11/2001 | Hirota et al. .................. 438/424 |

* cited by examiner

Primary Examiner—Benjamin L. Utech
Assistant Examiner—Lynette T. Umez-Eronini
(74) Attorney, Agent, or Firm—Skjerven Morrill LLP; David W. Heid

(57) ABSTRACT

Chemical-mechanical processing of a patterned substrate selectively etches patterned portions of the substrate surface, producing deep narrow features with a rapid etch rate. This chemical-mechanical processing is termed chemical-mechanical etching and produces a result that is substantially the opposite of the planarization that is achieved by conventional chemical-mechanical polishing (CMP). A chemical-mechanical polishing (CMP) technique which is widely used for planarization of surfaces is converted for usage as an etching technique, a chemical-mechanical etching (CME) technique, by forming a patterned mask on the substrate surface prior to mechanical polishing. The usage of chemical-mechanical polishing techniques in this manner yields an etching method with properties including a rapid etch rate, a highly controllable etch rate, a highly controllable etch depth, and a greatly selective etch directionality. A coating that inhibits the removal of the substrate material protects selectively patterned areas of a substrate, thereby creating a recess in substrate areas that are not protected by the coating.

22 Claims, 3 Drawing Sheets

CHEMICAL-MECHANICAL ETCH (CME) METHOD FOR PATTERNED ETCHING OF A SUBSTRATE SURFACE

BACKGROUND OF THE INVENTION

1. Field of the Invention

The present invention generally relates to a method for fabricating micromagnetic, microelectronic or micro-optical devices or components on a substrate. More specifically, the present invention relates to a chemical-mechanical etch (CME) method for patterned etching of a substrate surface.

2. Description of the Related Art

Various etching techniques are used in the fabrication of various microminiature structures and devices to form patterns in a substrate for many applications. An etching technique which is suitable for a particular purpose etches selected layers in a structure without damaging other layers and forms structures with a sufficient etch rate, etch rate selectivity and directional selectivity that a specified end product is produced efficiently.

A wet etching technique employs liquid chemicals, such as acids or corrosive materials, as an etching agent. The etching process proceeds through chemical reactions at the surface of the etched material and is limited by the rate of chemical reactions and the rate of removal of products of the chemical reaction. In some applications the wet etching process is electrically aided by connecting the structure to be etched either an anode or a cathode of an electrolytic cell. Unfortunately, wet etching has several disadvantages. Direction etch selectivity is typically very poor for wet etchants. One result of this poor direction etch sensitivity is a large line-width loss that precludes the usage of wet etching to form narrow lines that are common in many applications. Furthermore, the etch rate is only marginally controllable for many wet etchants. A further disadvantage is that wet etching requires the handling, use and disposal of highly toxic and corrosive chemicals, raising cost and safety concerns.

An alternative type of etching is dry etching, or plasma-assisted etching, which uses either chemical or physical reactions between a low-pressure plasma or glow discharge and the surface to be etched in a gas phase. Dry etching is a complex process with results that are greatly affected by small variations in process parameters. Dry etching typically is used to pattern smaller geometries than wet etching and has lateral etch rates that are small so that the etched pattern is highly controllable and smooth edge profiles are produced. Advantages of dry etching are a highly directional etch anisotropy and a facility to penetrate small photoresist apertures for etching small and intricate geometries.

Plasma etching is a process in which a plasma generates reactive species that chemically etch material in direct proximity with the plasma. Plasma etching is typically used to etch photoresists, silicon dioxide ($SiO_2$), silicon nitride ($Si_3N_4$), aluminum, polysilicon and metal silicides. If the chemical reactions are enhanced by the kinetic energy of the ions in the plasma, the process is a kinetically-assisted chemical reaction. Reactive ion etching is similar to plasma etching but only uses kinetically-assisted chemical etching. Reactive ion beam etching separates the wafers from the plasma by a grid that accelerates the ions created in the plasma towards the wafer, raising the ion energy so that some etching is caused by physical reactions.

Sputter etching uses energetic ions from the plasma to physically wrench (sputter) atoms from the substrate surface without assistance by chemical reactions.

Ion milling is a purely mechanical etching method that uses a roughly collimated beam of energetic ions to erode a surface by bombardment. Ion milling advantageously can be applied at angles other than an angle perpendicular to the substrate wafer.

The etch rate achieved by the various etching techniques is widely variable depending on the characteristics of the material to be etched and etchant characteristics such as the selected chemical for chemical etching methods and the ion, energy and density of the etching ions for ion etching methods. Typical etch rates are in the range of 100 to 3000 Å/min for most materials.

Some materials are not easily etched in a desired pattern using conventional etching methods. For example, various substrates resist etching using conventional patterned etching methods such as plasma etching. Chemical etching is not easily performed due to the usage of toxic chemicals and the poor directional selectivity of chemical etchants.

What is needed is a technique for etching hard materials that yields a rapid but controllable etch rate and directionality. What is also needed is an etching technique for hard materials that has high direction selectivity.

SUMMARY OF THE INVENTION

It has been discovered that chemical-mechanical processing of a patterned substrate is highly effective for selectively etching patterned portions of the substrate surface, producing deep narrow features with a rapid etch rate. This chemical-mechanical processing is termed chemical-mechanical etching and produces a result that is substantially the opposite of the planarization that is achieved by conventional chemical-mechanical polishing (CMP). Chemical-mechanical etching is useful for patterned etching of substrate materials including, for example, silicon, silicon dioxide, silicon nitride, gallium arsenide, polyimide, photoresist, aluminum, tungsten, molybdenum, titanium, glass, and the like.

In accordance with the present invention, a chemical-mechanical polishing (CMP) technique which is widely used for planarization of surfaces is converted for usage as an etching technique, more specifically a chemical-mechanical etching (CME) technique, by forming a patterned mask on the substrate surface prior to mechanical polishing. The usage of chemical-mechanical polishing techniques in this manner yields a surprisingly effective etching method with highly desirable properties including a rapid etch rate, a highly controllable etch rate, a highly controllable etch depth, and a greatly selective etch directionality.

In accordance with an embodiment of the present invention, a coating that inhibits the removal of the substrate material protects selectively patterned areas of a substrate, thereby creating a recess in substrate areas that are not protected by the coating.

In accordance with a specific embodiment of the present invention, a substrate is patterned with a diamond-like carbon (DLC) coating and etched using a chemical-mechanical etch (CME) process. The CME process forms deep narrow features having an angle essentially normal to the plane of the substrate surface.

Many advantages are achieved using the disclosed chemical-mechanical etch (CME) process. One advantage is that the CME process performs a highly anisotropic etch that forms sidewalls of an etched cut that are essentially vertical. Another advantage is that the CME process forms a highly controllable structure with substantially no undercutting of the mask. It is advantageous that the etch rate is relatively rapid (for example, approximately 1 μm per minute) so that processing throughput is facilitated, but also sufficiently linear and restrained so that precise control of the etch depth is facilitated.

Another advantage is that the usage of toxic and dangerous chemicals is avoided, thereby lowering processing costs and improving safety.

BRIEF DESCRIPTION OF THE DRAWINGS

The features of the invention believed to be novel are specifically set forth in the appended claims. However, the invention itself, both as to its structure and method of operation, may best be understood by referring to the following description and accompanying drawings.

DETAILED DESCRIPTION OF THE PREFERRED EMBODIMENTS

Figure 1A:
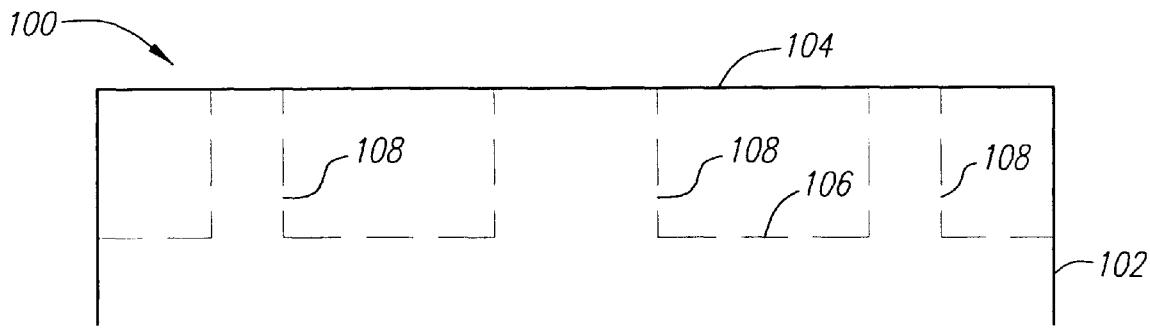
FIGS. 1A through 1D are a sequence of cross-sectional views of a substrate workpiece depicting steps of a method of etching the substrate workpiece using a chemical-mechanical etch process in accordance with an embodiment of the present invention.

Referring to FIGS. 1A through 1D, a sequence of cross-sectional views of a substrate workpiece 100 depict steps of a method of etching the substrate workpiece 100 using a chemical-mechanical etch process. FIG. 1A illustrates a substrate wafer 102 prior to processing. The substrate wafer 102 has an outer surface 104. The substrate wafer 102 is to be etched to form a recessed surface 106 of the substrate wafer 102 with one or more structures 108 extending essentially to the outer surface 104. The dimensions of the structures 108 are selected according to the intended application of the processed substrate workpiece 100. For example, in some embodiments, the structures 108 may take the form of lenses, pads, rails, pillars, slider arms, support structures or many other various structures. The substrate wafer 102 is composed of various substrate materials including, for example, silicon, silicon dioxide, silicon nitride, gallium arsenide, polyimide, photoresist, aluminum, tungsten, molybdenum, titanium, glass, and other suitable materials.

Figure 1B:
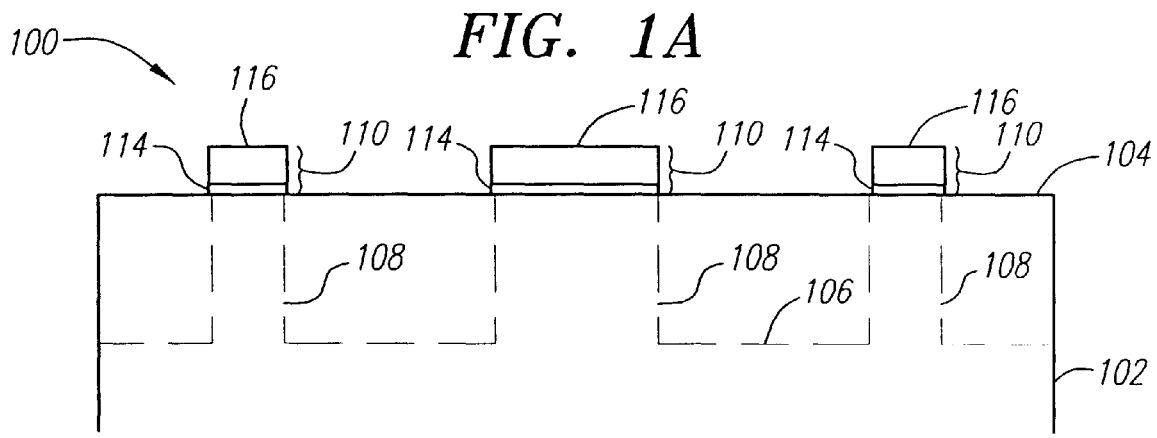

Referring to FIG. 1B, a protective layer 110 is formed overlying the outer surface 104 of the substrate workpiece 100. In one example, the protective layer 110 is deposited using plasma-enhanced chemical vapor deposition (PECVD) to deposit a silicon intermediate adhesion layer 114 overlying the substrate workpiece 100. A hard layer, for example a layer of diamond-like carbon (DLC) 116, is deposited on the substrate workpiece 100 overlying the silicon adhesion layer 114. The DLC layer 116 typically has a Knoop hardness ranging from approximately 700 Knoop to 2000 Knoop. In alternative embodiments, hard materials other than diamond-like carbon may be used which have a Knoop hardness in the range from approximately 700 Knoop to 3000 Knoop or more.

The DLC layer 116 is deposited via a chemical vapor deposition (CVD) process and patterned. More specifically, the DLC layer 116 and the silicon adhesion layer 114 are reactive ion etched.

The silicon adhesion layer 114 is sputter deposited on an exposed surface of the substrate wafer 102. The silicon adhesion layer 114 enables the DLC layer 116 to adhere to the substrate wafer 102. The silicon adhesion layer 114 typically has a thickness in a range from approximately 400 Å to approximately 1000 Å. A suitable thickness is about 600 Å.

The silicon adhesion layer 114 is sputter-cleaned prior to deposition of the DLC layer 116. During sputter cleaning, approximately 200 Å of the 600 Å silicon adhesion layer 114 is removed. In one embodiment, the silicon adhesion layer 114 is sputter-cleaned using a SAMCO plasma machine, Model No. PD-200D (Plasma Enhanced CVD System for DLC Deposition and Etching), called a "plasma machine". Sputter cleaning is performed with Argon in a plasma within the plasma machine vessel at a pressure of 70 mTorr with 180 watts RF input power at a frequency of 13.56 MHz. The flow rate of Argon is approximately 100 sccm. The substrate workpiece 100 is sputter-cleaned on a 6 inch diameter cathode (i.e. the energized electrode) of the SAMCO plasma machine, Model PD-200D, for approximately 3 to approximately 4 minutes.

Following Argon plasma cleaning (sputter etching), input power to the plasma machine is reduced to 110–150 Watts to the same 6 inch cathode electrode. The Argon source is terminated and a source of liquid hydrocarbon DLC source material is accessed. For example, one DLC source material that may be used is Part No. S-12 available from SAMCO, Sunnyvale, Calif. The pressure within the vessel ranges from approximately 20 mTorr to approximately 25 mTorr at a flow rate of source material of approximately 25 cm$^3$/min. Although the temperature is not specifically controlled during the process, the substrate wafer 102 is held on a water-cooled cathode while in the plasma machine. Under these conditions, a DLC deposition rate of approximately 1000 Å/min is obtained and maintained until the desired DLC thickness of approximately 5 μ is attained.

The resulting DLC layer 116 has a Knoop hardness of approximately 800. A DLC layer Knoop hardness of greater than 700 up to approximately 2000 Knoop produces an acceptably hard protective layer 110 for chemical-mechanical etching. The DLC layer 116 is then reactive ion etched.

Prior to exposing the substrate workpiece 100 to the reactive ion etch, the substrate workpiece 100 is covered with a layer of photoresist (not shown). The photoresist layer is patterned to include unprotected open regions overlying portions of the substrate wafer 102 that are to be etched. In this manner, when the substrate workpiece is subjected to the reactive ion etch, the portions of DLC layer 116 overlying portions of the substrate wafer 102 to be etched are removed and the remaining portions of the DLC layer 116 are protected and remains as DLC layer 116.

An alternative method to the above described photoresist masking approach to patterning the protective layer 110 is to cover the substrate wafer 102 with a metal layer constructed from a metal such as chromium. For example, a relatively thin (for example, 500 Å in thickness) photomask layer (not shown) of chromium is sputtered over the DLC layer 116. The metal photomask layer is photo-patterned and etched to expose DLC areas which are to be excavated by reactive ion etching. The DLC layer is then reactive ion etched to the desired DLC structure.

DLC is advantageously used as a protective barrier in the protective layer 110 since DLC bonds well with various substrates, including examples of aluminum oxide (alumina), silicon dioxide, and glass, etch well in oxygen for removal of the DLC layer subsequent to etching. In other embodiments, hard materials other than DLC may be used as the protective barrier of the protective layer 110.

Figure 1C:
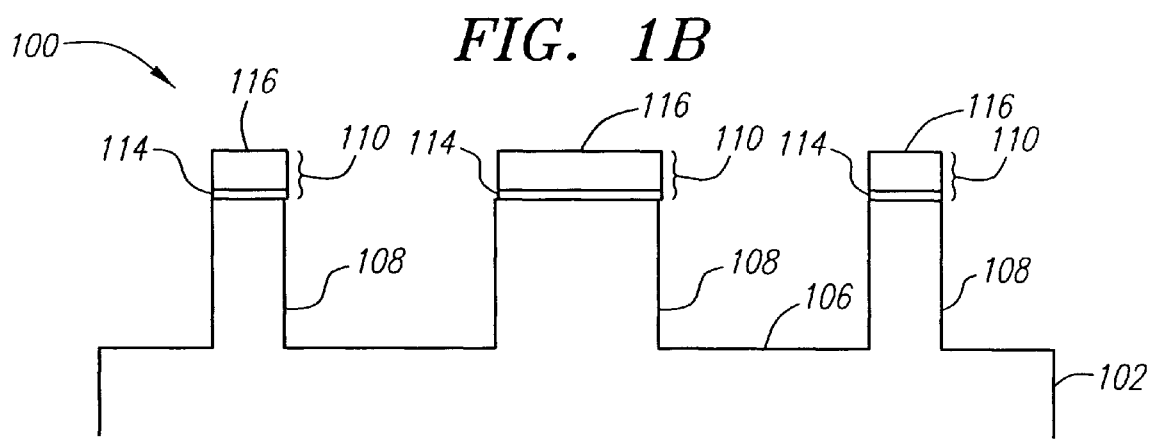

Referring to FIG. 1C, a chemical-mechanical processing step is applied to the outer surface 104 of the substrate workpiece 100 to selectively etch the portions of the substrate workpiece 100 that are not protected by the protective layer 110. Chemical-mechanical etching (CME) utilizes application of polishing pad in a typically orbital or planetary motion to a stationary thin film substrate. The orbital or planetary motion is applied to the thin film substrate by a lapping surface of the polishing pad to etch the areas of the substrate wafer 102 that are not covered by the protective layer 110.

CME processing involves application of a chemical slurry to the polishing pad and the thin film substrate workpiece to generate a chemical etching while the workpiece is mechanically contoured. The slurry is a mixture of a chemical etchant and an abrasive compound. As the slurry and polishing motion of the polishing pad are applied to the thin film substrate workpiece, the workpiece is lapped by a lapping surface of the polishing pad. Typically, the slurry contains chemical etchants that are nontoxic and benign so that disposal is inexpensive in contrast to conventional chemical etchants such as hydrochloric acid, which are unsafe and expensive to remove.

Figure 1D:
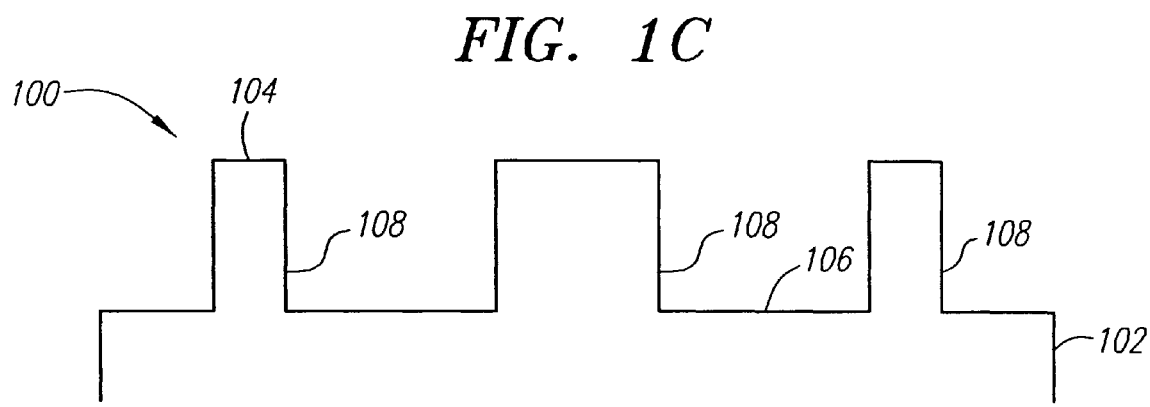

Referring to FIG. 1D, following etching of the substrate wafer 102 the protective layer 110 is removed by applying an etchant that preferentially etches the hard protective layer 110. In some embodiments, the entire protective layer 110 is removed including the silicon layer 112, the intermediate adhesion layer 114, and the diamond-like carbon (DLC) layer 116. In other embodiments, the DLC layer 116 alone may be removed. An oxygen-rich liquid, such as hydrogen peroxide ($H_2O_2$), preferentially etches DLC. In other embodiments, other oxygen-rich etchants may be used including HOCl, KOCl, $KMgO_4$, and $CH_3COOH$.

Referring again to FIGS. 1A through 1D, a more specific embodiment of the method of etching the substrate workpiece 100 using a chemical-mechanical etch process is described. In the specific embodiment, the substrate wafer 102 is most commonly a substrate such as alumina or glass. In other examples, the substrate wafer 102 is selected from among silicon, silicon dioxide, silicon nitride, gallium arsenide, polyimide, photoresist, aluminum, tungsten, molybdenum, titanium, and other suitable materials. Protective layer 110 shown in FIG. 1B is deposited including the DLC layer 116 having a thickness of approximately 3.5 $\mu$m. The chemical-mechanical etch process is performed using an eighteen inch "soft" polishing pad and disk which is rotated at a rate of about 60 rpm. The pressure applied to the substrate wafer 102 by the polishing pad is approximately 2.5 psi. The soft polishing pad is flooded, or saturated, with Rodel R-94 slurry. One example of a soft polishing pad is a Model 205 pad from Rodel Products Corp. of Scottsdale, Ariz.

The polishing pad and the slurry are selected to achieve a desired etching performance. In general, a soft polishing pad forms a deeper trench and a harder polishing pad forms a more shallow trench.

The substrate workpiece 100 is chemical-mechanical etched for a suitable time to etch a desired depth into the substrate wafer 102. In the illustrative example, the substrate wafer 102 is chemical-mechanical etched at a substantially linear rate of approximately 1 $\mu$m per minute.

Figure 2A:
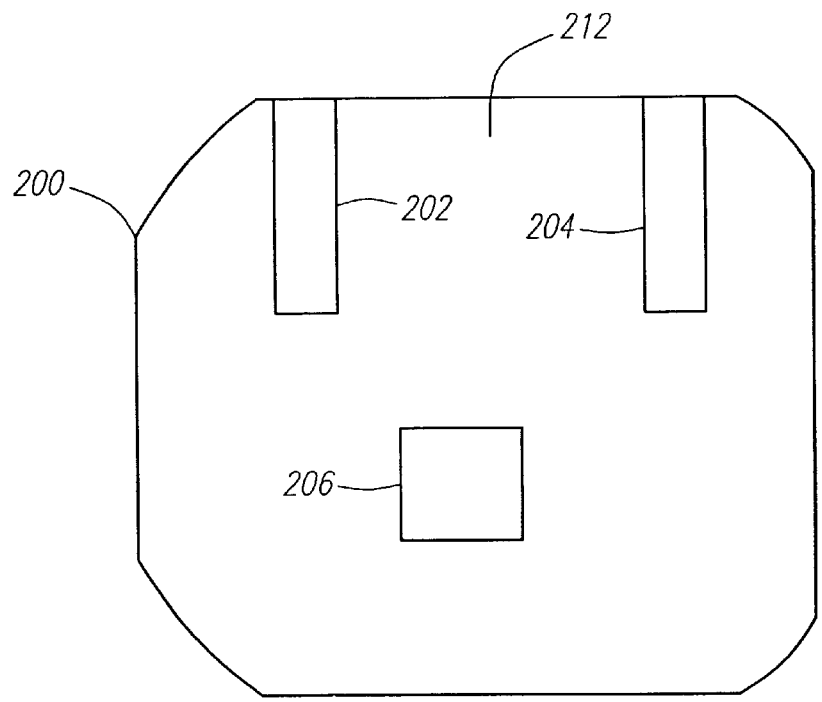
FIG. 2A is a two-dimensional top view of the substrate workpiece subsequent to the chemical-mechanical etch process described in FIGS. 1A through 1C.
Figure 2C:
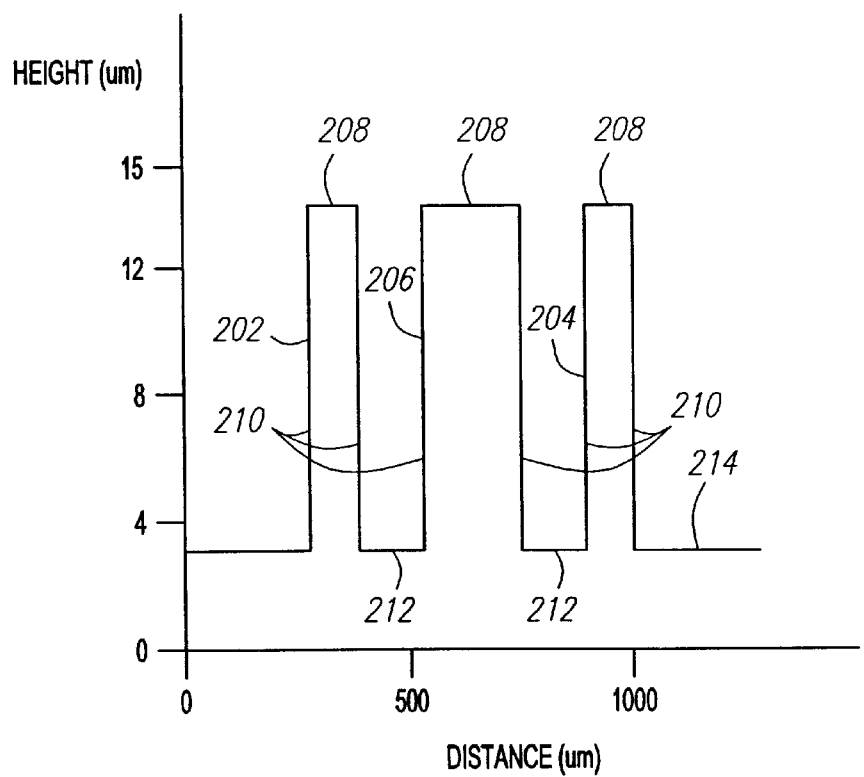
FIG. 2C is a profile plot of the substrate workpiece subsequent to chemical-mechanical etch process described in FIGS. 1A through 1C.
Figure 2B:
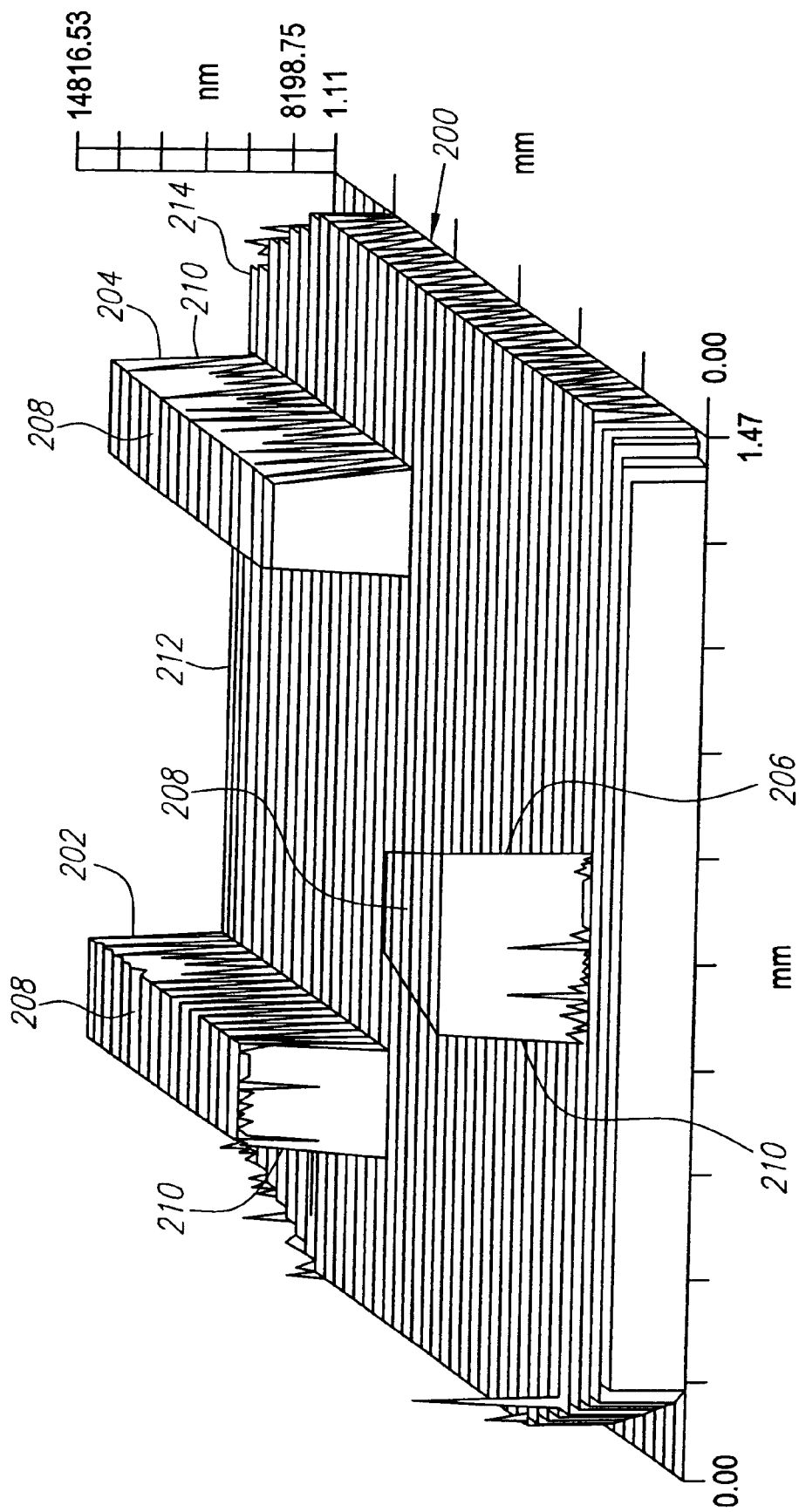
FIG. 2B is a three-dimensional scanning interferometric microscope image of the substrate workpiece following application of the chemical-mechanical etch process described in FIGS. 1A through 1C.

FIGS. 2A, 2B, and 2C are depictions of a substrate workpiece 200, in particular a magnetic recording head slider, subsequent to CME processing respectively represented by a two-dimensional top view of the substrate workpiece 100 (FIG. 2A), a three-dimensional scanning electron micrograph (SEM) image (FIG. 2B), and a profile plot (FIG. 2C). The substrate workpiece 200 is etched following application of a pattern defining two slider rails 202 and 204 arranged in substantially parallel lines and a pad 206 having a rectangular shape when viewed from the top view of the substrate workpiece 200. The pad 206 is positioned substantially along a center line equidistant between the two slider rails 202 and 204. The pad 206 and the two slider rails 202 and 204 are protected from etching by the protective layer 110 during etching so that trenches having a depth of approximately 15 $\mu$m are formed surrounding the pad 206 and two slider rails 202 and 204. At an etch rate of approximately 1 $\mu$m per minute, a trench is formed in approximately 15 minutes. At a top surface 208 of the substrate workpiece 200, the pad 206 and the two slider rails 202 and 204 form a coplanar surface. Side walls 210 of the pad 206 and the two slider rails 202 and 204 are substantially vertical and a trench 212 that is formed using the CME processing has a highly uniform depth with the floor 214 of the trench 212 forming essentially a 90 degree angle with the side walls 210 of the pad 206 and the two slider rails 202 and 204. The slope of the side walls 210 and the uniformity of the trench depth are dependent upon characteristics of the CME operation including the type of slurry and hardness of the polishing pad.

The three-dimensional interferometric microscope image shown in FIG. 2B illustrates the highly advantageous structure that is produced using the CME process. Essentially no undercutting of the DLC mask takes place. Thus the CME process forms a highly anisotropic etch so that the walls of an etched cut are substantially vertical.

In a conventional chemical etching process, a substrate may have a crystal axis with a defined orientation so that etching occurs preferentially depending on the orientation of the crystal. Properly orienting of the substrate is generally difficult or impossible. Chemical-mechanical etching (CME) etches the substrate according to the arrangement of the DLC mask regardless of the orientation of the substrate crystal axis.

Chemical-mechanical etching (CME) is a process that is similar to conventional chemical-mechanical polishing (CMP) except that the CME process uses a patterned protective mask layer at the surface of the substrate to selectively protect regions of the substrate that are protected from etching. The result of the CME process is nearly the opposite of the result of CMP with the CME process forming a structure with high topographical variability and the CMP process forming a planar surface.

Conventional chemical-mechanical polishing (CMP) is a known technique for planarizing various structures on a thin film substrate. CMP is conventionally used to create a smooth, planar surface for intermediate processing steps of a thin film fabrication process. Specifically, various layers such as metallization layers are deposited and etched during the fabrication of thin film devices on a substrate. These layers are commonly subjected to CMP so that planar deposition of additional layers is achieved. CMP processing not only is used to planarize protruding surfaces, but also to remove undesirable residues that remain from other substrate processing steps.

CMP involves simultaneously chemically etching and mechanical polishing or grinding of a surface so that a combined chemical reaction and mechanical polishing removes a desired material from the substrate surface in a controlled manner. The resulting structure is a planarized substrate surface with protruding surface topography leveled. CMP is typically performed by polishing a substrate surface against a polishing pad that is wetted with a slurry including an acidic or basic solution, an abrasive agent and a suspension fluid.

The special CME processing that is used to precisely etch a substrate is different from a conventional CMP process on the basis that the CME process includes the formation of a patterned hard mask layer, such as a patterned DLC layer, on the surface of a substrate and the hard mask layer serves to protect patterned regions of the substrate while unprotected regions are etched. Once the hard mask layer is formed on the substrate, the CME process is substantially the same as conventional CMP processing techniques that are otherwise used to planarize surface structures in intermediate steps of integrated circuit fabrication. CME processing is selectively performed using a wide range of mechanical polishing techniques employing polishing pads ranging from hard pads to soft pads, various slurry materials, polishing speeds throughout the range of CMP processes, for example a speed of 50 or more revolutions per minute (rpm), corresponding to a linear speed of 25 inches per second (ips), or faster. CME mechanical polishing is applied at a conventional range of pressures from a relatively high pressure to a relatively low pressure. In one example, the procedure involves a mechanical polishing using a hard polishing pad applied at a high speed and low pressure of about 2 psi or less. A typical speed and pressure of a conventional process is 60 rpm and 8 psi. A hard polishing pad typically has a compressibility of less than about ten or twelve percent. Conventional CMP processing procedure typically uses a slurry with an etchant that achieves etching through either chemical or physical reactions taking place between a plasma and the surface to be etched.

In one example, the special CME processing for etching an alumina or glass substrate using a DLC mask employs a compliant, or soft, polishing pad which develops an advantageous etch shape with substantially vertical structure walls and a substantially uniform trench depth. One example of a soft polishing pad is a Model 205 pad from Rodel Products Corp. of Scottsdale, Arizona. This soft polishing pad is constructed from napped poromeric synthetics and has a compressibility of from 20 to 38 percent. In contrast, a typical hard polishing pad is constructed from polyurethane impregnated polyester felts. The mechanical etching of the special CME process also employs a soft polishing pad applied at a relatively low speed and a relatively high pressure to the thin film substrate surface. The softness of the polishing pad is selected to determine the shape and contour of the etched substrate surface, specifically to achieve substantially vertical structure walls and a uniform trench depth. The low speed of the special CME processing is typically on the order of ⅓ the speed of a conventional CMP process. For example, a typical low processing speed is approximately 10 RPM to 40 RPM, corresponding to a linear speed of 5 ips to 20 ips. The relatively high pressure of the special CME processing is typically on the order of two to three times the pressure of a conventional CMP procedure. For example, a typical high processing pressure is approximately 2 psi to 10 psi. The special CME processing employs either conventional orbital motion of the polishing pad or a rectilinear motion between the thin film substrate and the polishing pad table. Slurry may be applied either lightly for heavily in the special CME processing.

The CME process utilizes a mechanical action, which is generated by movement on a suitable surface, or "lap". The surface of a thin film substrate to be etched using CME is substantially saturated with a slurry that contains a chemical etchant. The mechanical action etches the unprotected regions of the substrate while the protected regions remain, producing a structure with substantially vertical side walls and a highly uniform trench depth.

While the invention has been described with reference to various embodiments, it will be understood that these embodiments are illustrative and that the scope of the invention is not limited to them. Many variations, modifications, additions and improvements of the embodiments described are possible. For example, although the material which is etched using the CME process is an alumina or glass material, other materials may be etched using the described CME process including silicon, silicon dioxide, silicon nitride, gallium arsenide, polyimide, photoresist, aluminum, tungsten, molybdenum, titanium, glass, and other suitable materials. Also, although a protective structure of the mask material is described as being a diamondlike carbon (DLC) structure, other types of protective materials may be used. Furthermore, the CME process is described using a polishing pad that is saturated with slurry. In other embodiments, various other amounts of slurry may be utilized including small amounts of slurry. In addition, various hardnesses of polishing pads may be used ranging from hard pads to soft pads.

Although the illustrative method is shown applied to the fabrication of a magnetic thin film head slider structure, the method may be applied to a wide variety of structures. One example is the fabrication of air bearings on an aluminum substrate.

What is claimed is:

1. A method of etching a substrate comprising:
   forming a patterned protective layer composed of a hard material on a surface of a substrate; and
   chemical-mechanical etching (CME) the substrate using a chemical-mechanical polishing technique to form an etched substrate structure having elevated structures in regions of the substrate that are protected by the patterned protective layer and having trenches in regions of the substrate that are not protected by the patterned protective layer.

2. A method according to claim 1 wherein:
   the forming step includes the step of forming a patterned protective layer composed of a hard material is composed of diamond-like carbon (DLC).

3. A method according to claim 2 wherein:
   the forming step includes the step of forming the diamond-like carbon (DLC) patterned protective layer with a Knoop hardness in a range from approximately 700 to approximately 2000.

4. A method according to claim 1 further comprising:
   chemical-mechanical etching (CME) the substrate so that the elevated structures have substantially vertical side walls.

5. A method according to claim 1 further comprising:
   chemical-mechanical etching (CME) the substrate so that the trench structures have a substantially uniform depth.

6. A method according to claim 1 further comprising:

providing a glass substrate; wherein the forming step includes the step of forming a patterned protective layer composed of a hard material is composed of diamond-like carbon (DLC).

7. A method according to claim 1 further comprising:

providing an alumina substrate; wherein the forming step includes the step of forming a patterned protective layer composed of a hard material is composed of diamond-like carbon (DLC).

8. A method according to claim 1 further comprising:

providing a substrate selected from among silicon, silicon dioxide, silicon nitride, gallium arsenide, polyimide, photoresist, aluminum, tungsten, molybdenum, and titanium; wherein the forming step includes the step of forming a patterned protective layer composed of a hard material is composed of diamond-like carbon (DLC).

9. A method according to claim 1 wherein the forming step includes:

depositing a silicon adhesion layer on a surface of the substrate; and depositing a patterned protective layer composed of diamond-like carbon (DLC).

10. A method according to claim 1 wherein:

the CME step includes the step of contouring the thin film substrate using a orbital, planetary motion.

11. A method according to claim 1 wherein:

the CME step includes the step of contouring the thin film substrate using a rectilinear motion.

12. A method according to claim 1 further comprising:

patterning the patterned protective layer using a reactive ion etch process.

13. A method of etching a substrate comprising:

providing a substrate wafer having a surface;

forming a hard patterned protective layer on a surface of a substrate to form protected regions and unprotected regions of the substrate surface; and chemical-mechanical polishing (CMP) the substrate, the chemical-mechanical polishing step etching the substrate in unprotected regions to form trenches adjacent to the protected regions of the substrate surface.

14. A method according to claim 13, further comprising:

chemical-mechanical polishing (CMP) the substrate so that the elevated structures have substantially vertical side walls.

15. A method according to claim 13 further comprising:

chemical-mechanical polishing (CMP) the substrate so that the trench structures have a substantially uniform depth.

16. A method according to claim 13 wherein:

the forming step includes the step of forming a patterned protective layer composed of a hard material is composed of diamond-like carbon (DLC).

17. A method according to claim 16 wherein:

the forming step includes the step of forming the diamond-like carbon (DLC) patterned protective layer with a Knoop hardness in a range from approximately 700 to approximately 2000.

18. A method according to claim 13 further comprising:

providing a glass substrate; wherein the forming step includes the step of forming a patterned protective layer composed of a hard material is composed of diamond-like carbon (DLC).

19. A method according to claim 13 further comprising:

providing an alumina substrate; wherein the forming step includes the step of forming a patterned protective layer composed of a hard material is composed of diamond-like carbon (DLC).

20. A method according to claim 13 further comprising:

providing a substrate selected from among silicon, silicon dioxide, silicon nitride, gallium arsenide, polyimide, photoresist, aluminum, tungsten, molybdenum, and titanium; wherein the forming step includes the step of forming a patterned protective layer composed of a hard material is composed of diamond-like carbon (DLC).

21. A method according to claim 13 wherein the forming step includes:

depositing a silicon adhesion layer on a surface of the substrate; and depositing a patterned protective layer composed of diamond-like carbon (DLC).

22. A method according to claim 13 further comprising:

patterning the patterned protective layer using a reactive ion etch process.

* * * * *